United States Patent
Eleyan et al.

(10) Patent No.: US 7,131,034 B2
(45) Date of Patent: Oct. 31, 2006

(54) ON-CHIP MEASUREMENT OF SIGNAL STATE DURATION

(75) Inventors: Nadeem N. Eleyan, Austin, TX (US);
Harsh D. Sharma, Austin, TX (US);
Howard L. Levy, Cedar Park, TX (US); Hong S. Kim, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 687 days.

(21) Appl. No.: 10/292,329

(22) Filed: Nov. 12, 2002

(65) Prior Publication Data

US 2004/0093535 A1 May 13, 2004

(51) Int. Cl.
*G06F 11/00* (2006.01)
(52) U.S. Cl. .......................... 714/30; 714/55
(58) Field of Classification Search ................ 714/30, 714/33, 37, 43, 815, 819, 55; 327/175
See application file for complete search history.

(56) References Cited

U.S. PATENT DOCUMENTS

| | | | |
|---|---|---|---|
| 5,923,195 A * | 7/1999 | Graf, III ..................... | 327/144 |
| 6,219,305 B1 * | 4/2001 | Patrie et al. ................ | 368/113 |
| 6,326,827 B1 | 12/2001 | Cretti et al. ................ | 327/175 |
| 6,442,722 B1 * | 8/2002 | Nadeau-Dostie et al. ... | 714/731 |
| 6,518,809 B1 | 2/2003 | Kotra ......................... | 327/175 |
| 6,912,681 B1 * | 6/2005 | Schoeber .................... | 714/738 |
| 2004/0041609 A1 | 3/2004 | Lin ............................ | 327/175 |
| 2004/0075462 A1 | 4/2004 | Kizer et al. ................. | 326/29 |
| 2004/0268280 A1 * | 12/2004 | Eleyan et al. ............... | 716/6 |

* cited by examiner

*Primary Examiner*—Nadeem Iqbal
(74) *Attorney, Agent, or Firm*—Robert C. Kowert; Meyertons, Hood, Kivlin, Kowert & Goetzel, P.C.

(57) ABSTRACT

A signal duration measurement system compares a known duration, T1, of a test data signal with the duration, T2, of a state of a signal under test. In one embodiment, if T2 compares favorably with T1, then the circuit generating the signal under test 'passes.' Otherwise the signal under test 'fails,' and a problem has been identified. Furthermore, in one embodiment, T1 can be selectively adjusted to more accurately measure T2. In one embodiment, the test data signal is allowed to travel a signal path, having a known signal propagation delay time, during a single state of the signal under test. The data signal at the beginning of the state, e.g. during the rise of the signal under test, is compared to the data signal captured at the end of the state, e.g. during the fall of the signal under test. If the initial and captured data signals are the same, then the duration of the state of the signal under test is greater than or equal to the signal propagation delay time. The signal propagation time can be adjusted by inserting varying delay elements into the signal path traversed by test data signal. The signal duration measurement system can be fabricated on-chip, thus making its use more practical. The signal duration measurement system is, for example, useful for measuring the state duration of signals such as self-resetting signals, which are difficult to externally measure.

26 Claims, 7 Drawing Sheets

ON-CHIP MEASUREMENT OF SIGNAL STATE DURATION

BACKGROUND OF THE INVENTION

1. Field of the Invention

The present invention relates in general to the field of integrated circuits, and more specifically to a system and method for measuring the duration of a signal's state using on-chip circuits.

2. Description of the Related Art

Integrated circuits typically utilize many on-chip timing and control signals. Signals have states. For example, a binary signal has high and low states, which are often referred to as "1" and "0," respectively. Many integrated circuit designs depend on a proper duration of a signal's state for accurate performance. For example, in a flip-flop based integrated circuit design, it is typically critical to ensure that a coupled clock frequency is stable at an optimum required clock cycle to allow enough time for critical paths to fully evaluate before the next clock cycle. If the clock frequency increases, the longest path may not be able to fully evaluate before the next clock cycle and the circuit would not function as desired. In another example, some integrated circuit designs, a circuit is supposed to evaluate in one half-clock cycle instead of a full clock cycle.

Other circuits, such as self-resetting circuits, have particular timing issues. For example, in self-resetting circuits, a pulse width of a reset signal, generated by the circuit itself, determines the evaluation period. Such designs are typically very sensitive to process variations. Also, unlike clock-based designs, where the circuit may fail at some frequency but function properly if the clock frequency increases, once a self timed circuit fails, it fails at any clock frequency. This is because the pulse width of the self-reset signal is hard coded in the circuit and is not controlled by an external clock. Some technologies are particularly susceptible to having and even developing timing problems over a period of time. For example, in some small-scale device technologies, "Negative Bias Temperature Instability" (NBTI) can cause the voltage threshold of PMOS devices to increase by a certain voltage level depending on the historical amount of voltage bias present between the gate and source/drain nodes of the PMOS device. A sufficient increase in voltage thresholds can generate, the self reset signal and cause variations in the pulse width of the self reset signal, which results in a hard failure at all clock frequencies.

Detecting a circuit failure caused by timing in a circuit, such as a self-resetting circuit, is very difficult using conventional technology. Conventional technology often requires probing signal paths on a chip that carry the self reset signal. A visual inspection of the waveform is performed to determine if the signal path being probed is causing the failure. Such analysis is both expensive and time consuming. Furthermore, such a test typically needs to be performed directly on silicon and cannot be performed on a packaged chip. Identifying which circuit(s) malfunction is causing the failure is also typically very difficult.

SUMMARY OF THE INVENTION

Embodiments of a signal state duration measurement system technology allow measurement of signal state durations using on-chip technology. In one embodiment a method includes selecting a propagation time $T1$ of a data signal and allowing the data signal to propagate along a signal path on the chip during a propagation time $T1$. The beginning of the propagation time $T1$ is determined by a signal tinder test having a state period of $T2$. The method also includes capturing the data signal on the signal path by the end of the propagation time $T1$ using the on-chip circuitry, wherein the end of the propagation time $T1$ is also determined by the signal under test and comparing the captured data signal with the received data signal to determine a relationship between time $T1$ and period $T2$, wherein period $T2$ equals $t2$ minus $t1$.

In anther embodiment of the present invention, a method includes receiving a data signal using on-chip circuitry at time $t1$, wherein time $t1$ is determined by a signal under test. The method further includes maintaining a state of the data signal for a period $T1$, capturing the data signal using the on-chip circuitry at time $t2$, wherein time $t2$ is also determined by the signal under test, and comparing a state of the captured data signal with the state of the received data signal to determine a relationship between period $T1$ and period $T2$, wherein period $T2$ equals $t2$ minus $t1$.

In anther embodiment of the present invention, a method of measuring a state duration of an on-chip signal under test using on-chip circuitry includes (a) selecting a delay element along a signal path, (b) causing a first switch at the beginning of the signal path and a second switch at the end of a signal path to conduct upon a state change of the signal under test, and (c) allowing a test data signal with a first state to propagate along the signal path and through the delay element to the second switch for a period of time $T1$. The method further includes (d) causing the first switch and the second switch to stop conducting upon a next change of state of the signal under test, wherein the signal under test changes state after a period of $T2$, (e) latching a state of the test data signal when the second switch stops conducting, and (f) comparing the latched test data signal state to the first state of the test signal. If the first state of the test signal fails to match the latched state of the test data signal, then the state duration of the signal under test is measured to be less than $T1$, and if the first state of the test signal matches the latched state of the test data signal, then the state duration of the signal under test is measured to be greater than $T1$.

In another embodiment of the invention, an apparatus includes a first on-chip switch having an input node to receive a data signal at time $t1$ and a conductivity control node to receive a signal under test, an on-chip delay circuit having an input node coupled to an output node of the first switch and having a selection node coupled to delay control circuitry, and an on-chip second switch having an input node coupled to an output node of the delay circuit and a conductivity control node to receive the signal under test. The apparatus further includes an on-chip data signal capture circuit coupled to an output node of the second switch to capture the data signal at time $t2$ and a comparison circuit coupled to the first switch and coupled to the data signal capture circuit to compare (a) the data signal received by the first on-chip switch when the signal under test at time $t3$ causes the first switch to conduct the data signal to (b) the data signal captured by the data signal capture circuit when the signal under test subsequently at time $t4$ causes the second switch to become nonconductive.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Embodiments of a signal state duration measurement system technology allow measurement of signal state durations using on-chip technology, which in many cases can be accomplished relatively quickly and inexpensively. A signal duration measurement system, such as signal state duration measurement system 100 (FIG. 1), is able to compare a known propagation time, T1, of a test data signal with the state duration, T2, of a signal under test. In one embodiment, if T2 compares favorably with T1, then the circuit generating the signal under test 'passes.' Otherwise it 'fails,' and a problem has been identified. Furthermore, in one embodiment, T1 can be selectively adjusted (increased or decreased), to more accurately measure T2. In one embodiment, the test data signal is allowed to travel a signal path, having a known signal propagation delay time, while the signal under test maintains a single state. The test data signal at the beginning of the state, e.g. during the rise of the signal under test, is compared to the test data signal captured at the end of the state, e.g. during the fall of the signal under test. If the initial and captured test data signals are the same, e.g., have the same state, then the duration of the state of the signal under test is greater than or equal to the signal propagation delay time. If the initial and captured test data signals are different, e.g., have different states, then the duration of the state of the signal under test is less than the signal propagation delay time. The test data signal propagation time can be adjusted by inserting varying delay elements into the signal path traversed by the test data signal. Thus, the state duration of a signal under test can be measured, with the degree of resolution being definable by a choice of the test data signal propagation path delay period.

Figure 1:
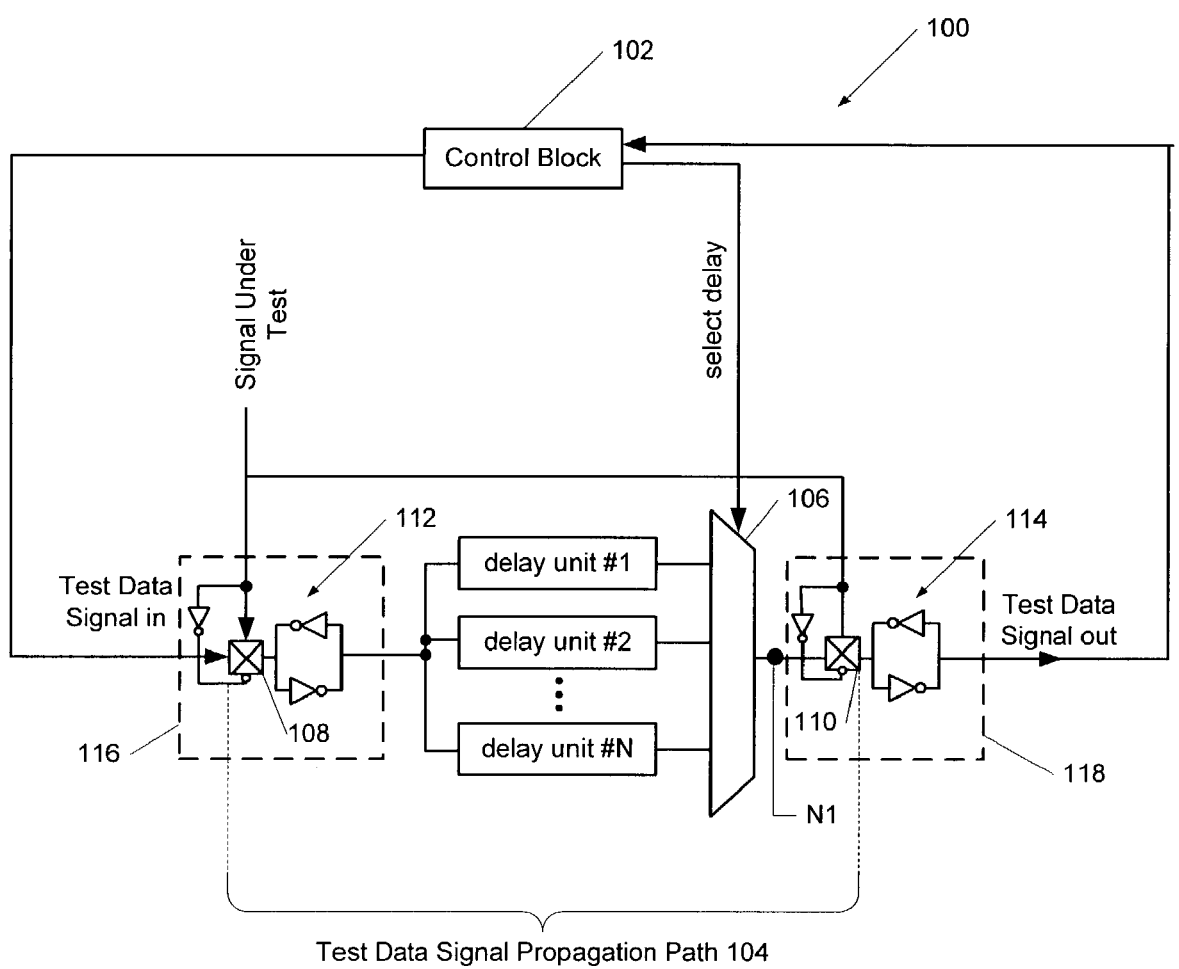
FIG. 1 depicts a signal state duration measurement system.
Figure 2:
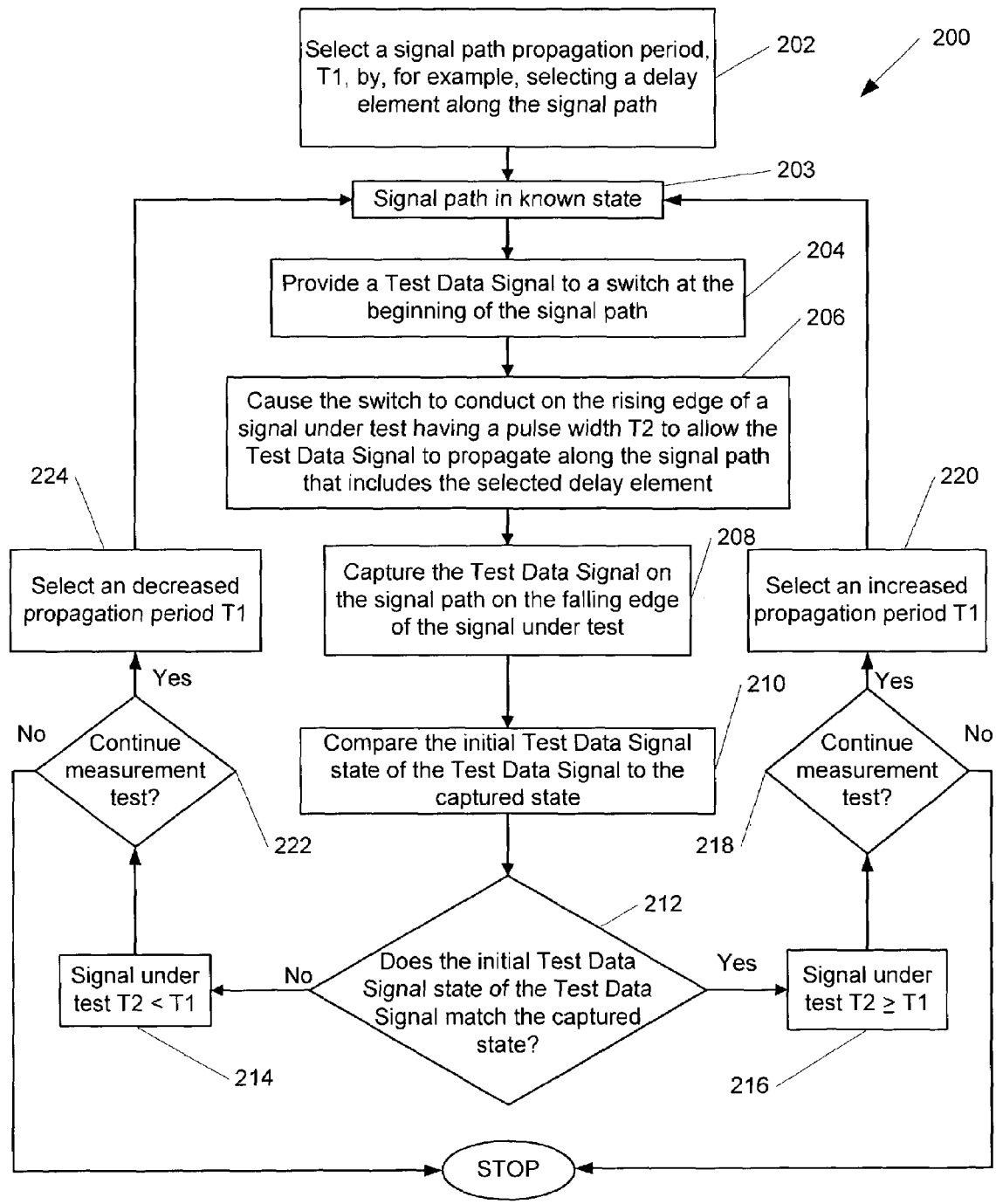
FIG. 2 depicts a signal state duration measurement process for use with the signal state duration measurement system of FIG. 1.

FIG. 1 depicts signal state duration measurement system 100, which is one embodiment of a signal state duration measurement system. In one embodiment, signal state duration measurement system 100 operates in accordance with the signal state duration measurement process 200 shown in FIG. 2. Additionally, signal state duration measurement system 100 can be fabricated entirely on-chip, e.g., as an integrated circuit fabricated on a single semiconductor wafer. In some embodiments, some or all functions of control block 102 delay units, or other components, may exist external to the chip. If so, an externally accessible pin is generally connected to the chip to provide access to data. The signal under test can be any signal of interest, such as self-resetting signals, particularly, but not exclusively, signals that are difficult to externally measure. The signal under test may be selected from multiple signals, all of which could be routed to signal state duration measurement system 100 and tested.

The signal state duration measurement system 100 utilizes the pulse width of the signal under test to begin and end the propagation of a test data signal to an output latch. If the propagation delay time and initial state of a test data signal are known and the pulse width of the signal under test is measured to be greater than or equal to than the propagation time of the test data signal, then the state of the test data signal will not change during the period of the signal under test's pulse width. In this case, the duration of the signal under test's pulse width is measured to be greater than or equal to the propagation delay of the test data signal. Likewise, if the pulse width of the signal under test is less than the propagation delay of the test data signal, then the initial test data signal will not match the test data signal captured at the end of the signal under test's pulse width. This is because the state of the test data signal will change at the capture point during the period of the signal under test's pulse width. In this case, the duration of the signal under test's pulse width is measured to be less than the propagation delay of the test data signal. As explained in more detail below, delay elements in the test data signal's propagation path can be varied to adjust the test data signal's propagation time. The in some embodiments, measurement indicates determination of a relationship between state of the signal under test and a propagation delay time of a test data signal.

The operation of signal state duration measurement system 100 begins with operation 202. In operation 202, control block 102 selects a propagation delay time of the test data signal, T1, by providing a delay select signal to a selection circuit, such as multiplexer 106. The delay select signal selects unit #X along the test data signal propagation path 104, with X being the desired delay unit of the N available delay units.

Figure 7:
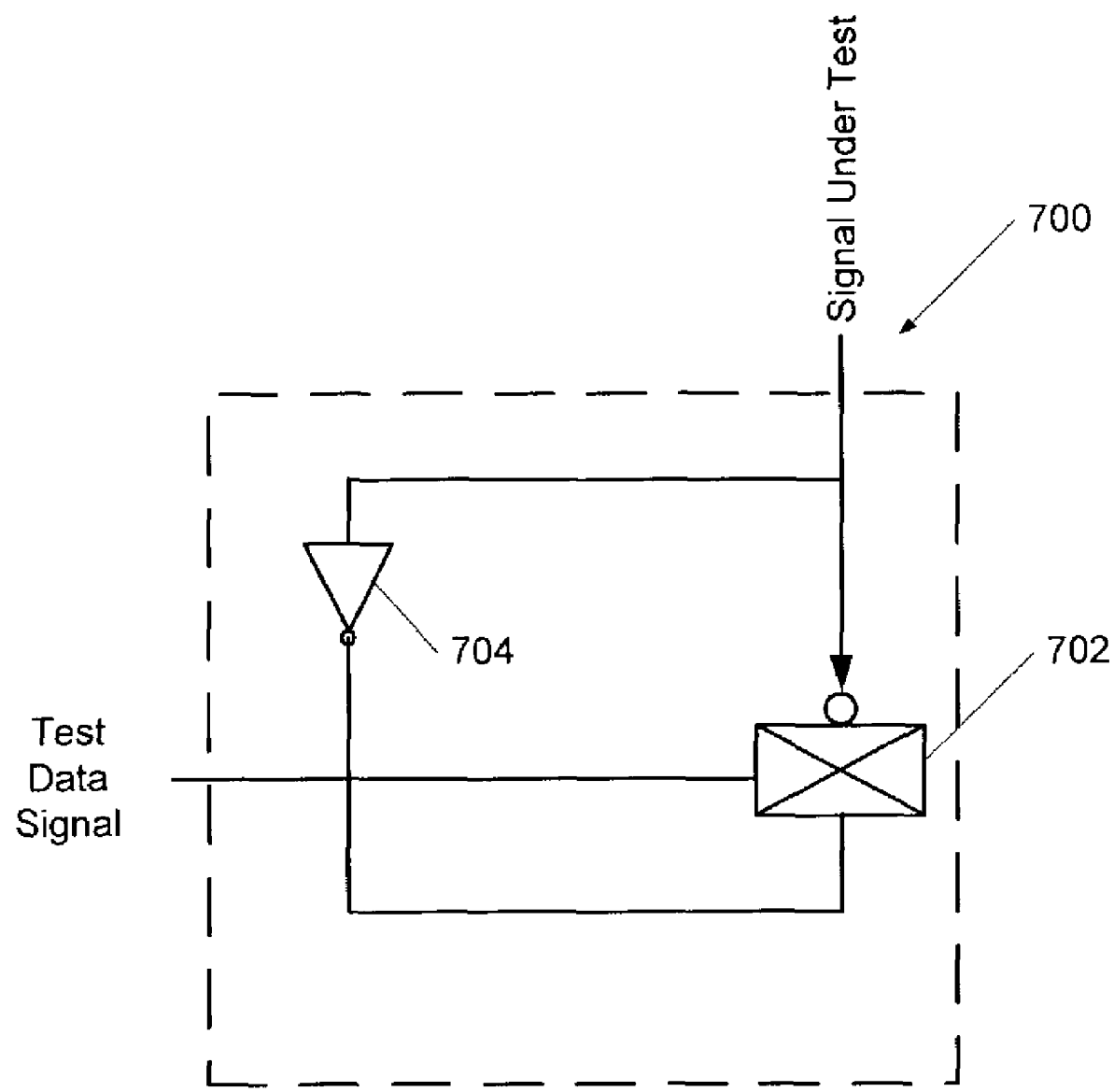
FIG. 7 depicts a gate and latch circuit useful in measuring 'low' state durations of a signal under test.

FIGS. 1 and 7 depict specific components of signal state duration measurement system 100. It will be apparent to those of ordinary skill in the art that other components can be used to create signal state duration measurement system 100. In one embodiment, switches 108 and 110 are N-channel metal oxide semiconductor field effect transistors (MOSFETs). Inverters 120 and 122 bias the substrates of switches 108 and 110, respectively, to increase switching speed. Latches 112 and 114 are, in one embodiment, cross-coupled inverters. Control block 102 can be virtually any circuit that includes the capability of providing the delay select signal, either in response to, for example, a user command or in response to predetermined programming.

Delay units can be configured in many ways and be made from a variety of different circuit elements, materials, and/or fabrication processes. In one embodiment, delay units 1:N (i.e. 1 through N) are circuits of a known delay that are substantially insensitive to process, voltage, and temperature (PVT) variations. Such circuits include inverters having substantially the same crystal orientations with channel widths and lengths that are large enough to be effectively insensitive to PVT variations. Generally, multiple transistors in parallel are less susceptible to PVT variations. Using longer channel transistors also makes circuits less susceptible to PVT variations. Transresistance devices could also be used as delay units. If transresistance devices are used, a resistance control signal from control block 102 may be used to select the resistance. If selection of particular transresistance devices is unnecessary during the selection of test data signal propagation path 104 delay time, multiplexer 106 can be eliminated. Groups of parallel delay units could also be fabricated in series with each other with multiple parallel and series paths to create many possible data signal propagation path 104 configurations. Providing variability of the data signal propagation path 104 delay allows for design flexibility in the measurement range and resolution of the state duration of the signal under test.

The number and delay value of the delay units can be configured according to the desired accuracy of measurements. For example, if the pulse width of the signal under test is anticipated to be 500 picoseconds plus or minus 250 picoseconds (corresponding to a 1 GHz signal with a 50% duty cycle) then 10 delay units (N=10) can be configured to provide delays in steps of 50 picoseconds. Similarly, if further measurement range and resolution is desired then 100 delay units (N=100) can be configured to provide delays in steps of 20 picoseconds, and so on. In one embodiment, the median propagation delay time is chosen to be the average pulse width of the signal(s) under test with an equal number of delay steps on either side of the median. The number and the value of the delay units can be determined based on several factors for example, the desired accuracy of the measurement, cost of delay units compared to the overall cost of the integrated circuit, design area available within the integrated circuit, complexity of routing and placement of other critical paths within the integrated circuits or the like. The total signal propagation time of data signal propagation path 104 also depends on the conductance delay of switches 108 and 110 after receiving a control signal, an inherent path delay of data signal propagation path 104 (e.g., transmission line impedance), and the like. Thus, in one embodiment, the total propagation delay of data signal propagation path 104 equals the sum of all signal propagation delay factors along data signal propagation path 104. It will be apparent to those of ordinary skill in the art that there are virtually limitless ways to construct and implement delay choices for signal state duration measurement system 100.

In operation 203, control block 102 places the data signal propagation path 104 into a known state different than the initial state of the test data signal by, for example, causing signal state duration measurement system 100 to propagate an inverted version of test data signal to be used by signal duration measurement process 200. In operation 204, the test data signal is received at the source of switch 108 while switch 108 is nonconductive. Thus, when switch 108 becomes conductive, the state of the test data signal will be known. In one embodiment of signal state duration measurement system 100, the state of the test data signal is 'high'. In another embodiment described below in conjunction with FIG. 7, the 'low' portion of test data signal is used to measure the duration of the signal under test.

Figure 3:
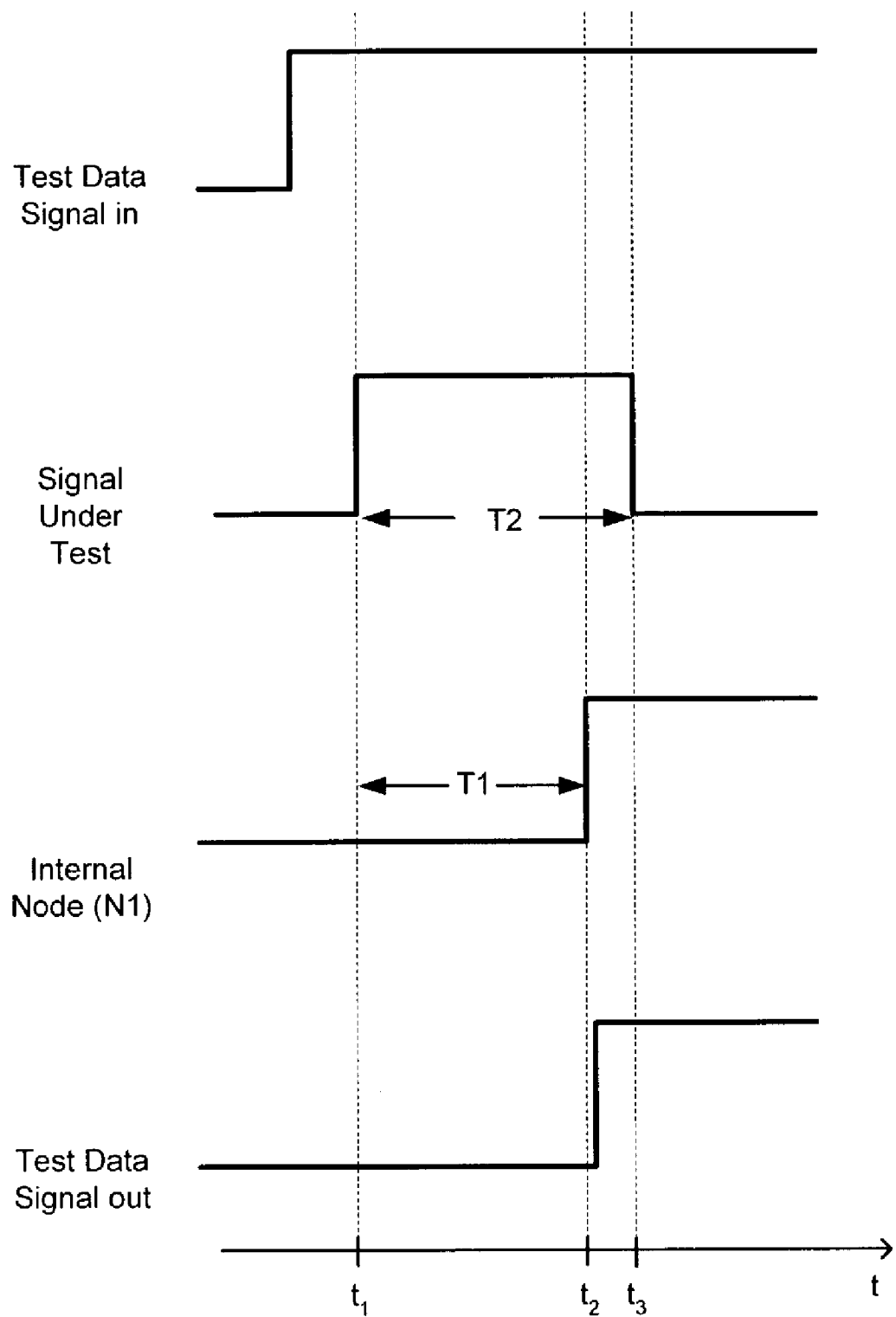
FIGS. 3 and 4 depict examples of various test data signal and signal under test waveforms that may be generated by the signal duration measurement system during the signal duration measurement process of FIG. 2.
Figure 4:
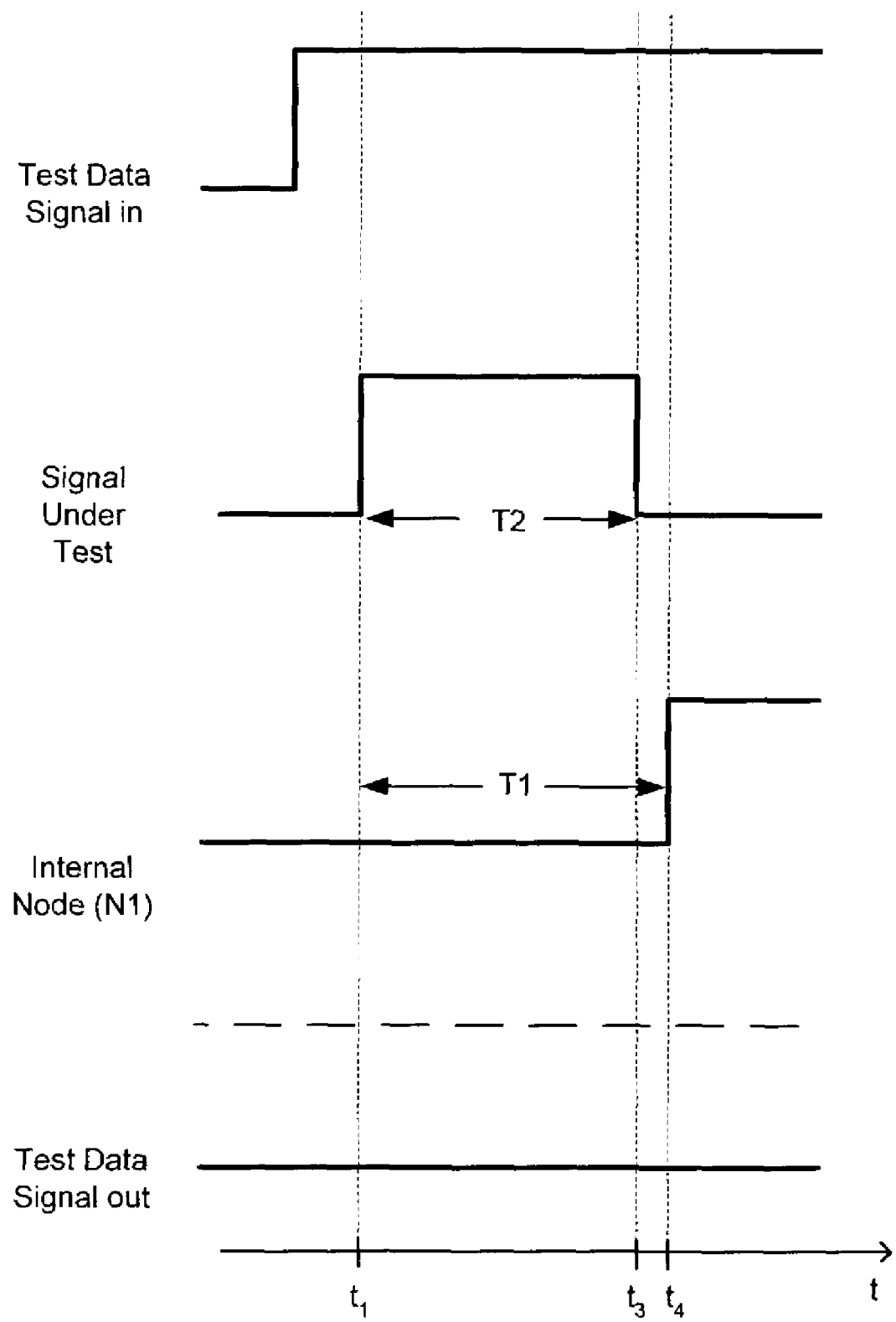

FIGS. 3 and 4 depict example test data signal and signal under test waveforms, discussed in conjunction with signal state duration measurement system 100 and process 200. Referring to FIG. 3, once the test data signal is in a known state at switch 108, in operation 206 (at time t1 (FIG. 3)) the signal under test is applied to the control terminal of switches 108 and 110 to cause them to conduct. Logic in control block 102 could be used to time the arrival of the signal under test to switches 108 and 110. From time t1 to time t2, the test data signal then propagates along data signal propagation path 104 through latch 112, through the delay unit selected by control block 102, and through multiplexer 106 to node N1. Note: in some embodiments node N1 is used to illustrate the state of the test data signal just prior to being captured by latch 114 and is not a physically separate component of the test data signal propagation path 104. In operation 208, at time t3, the signal under test transitions from 'high' to 'low' thereby causing switch 110 to become nonconductive. The test data signal is captured at time t3 by latch 114, which saves the state of the test data signal as of time t3 when switch 110 becomes nonconductive.

In operation 210, control block 102 compares the initial state of the test data signal "in" at time t1 with the state of the test data signal "out" at time t3, the time of test data signal capture. At time t1, the initial state of the test data signal is 'high,' and at time t3, the captured state of the test data signal is 'high'. Thus, as determined in operation 212 by control block 102, the initial state of the test data signal matches the captured state of the test data signal.

The signal duration measurement process 200 then proceeds to operation 216, which provides an indication that the pulse width T2 of the signal under test is greater than or equal to T1 (i.e. t2−t1). The indication could be provided, for example, to an off-chip analyzer or to control block 102, which could proceed according to a predetermined program. In operation 218, if a delay unit having a longer delay is not available and/or continuing the measurement test is not desired, operation 218 stops signal duration measurement process 200. If a delay unit having a longer delay is available and continuing the measurement test is desired, control block 102 provides a selection signal to multiplexer 106 to select a delay unit that will increase the signal propagation time of data signal propagation path 104. The signal duration measurement process 200 then returns to operation 203 and proceeds as described above. An example condition of when it would be desirable to continue measurement testing would be when increased resolution is desired and possible (e.g. a longer delay not previously used is available for selection), and it is desirable that T2 be greater than equal to T1. If it is desirable that the pulse width T2 of the signal under test is greater than or equal to T1, then the signal under test could be designated as "passes". If it is undesirable that the pulse width T2 of the signal under test is greater than or equal to T1, then the signal under test could be designated as "fails".

Referring to FIG. 4, assuming completion of operations 220 and 203, at t1 operation 206 causes switches 108 and 110 to conduct, and a "high" state test data signal propagates along data signal propagation path 104. In the example of FIG. 4, because a longer delay has already been selected in operation 220, the propagation delay time T1 of the test data signal is increased to t4−t1. At t3, the signal under test undergoes a state transition to 'low', switch 110 becomes nonconductive, and latch 114 captures the 'low' state of the test data signal out at t3. The state of internal node N1 does not change until t4, after switch 110 becomes nonconductive. In operations 210 and 212, a comparison of the initial and captured states of the test data signal determines that the states of test data signal in and test data signal out do not match. Thus, the pulse width of the signal under test T2 is less than T1 The indication in operation 214 could be provided, for example, to an off-chip analyzer or to control block 102, which could proceed according to a predetermined program. If a delay unit having a shorter delay but longer than any previously selected delay (thus, increased resolution is not available) is not available and/or continuing the measurement test is not desired, operation 222 stops signal duration measurement process 200.

If operation 222 determines that a delay unit having such shorter delay is available and continuing the measurement test is desired, then control block 102, in operation 224, provides a selection signal to multiplexer 106 to select a delay unit that will decrease the signal propagation period of data signal propagation path 104. The signal duration measurement process 200 then returns to operation 203 and proceeds as described above except that operation 218 would determine whether or not a previously unselected longer delay unit is available. An example condition of when it would be desirable to continue measurement testing would be when increased resolution is desired and possible and it is desirable that T2 be greater than equal to T1. If it is desirable that the pulse width T2 of the signal under test is less than T1, then the signal under test could be designated as "passes". If it is undesirable that the pulse width T2 of the signal under test is less than T1, then the signal under test could be designated as "fails".

Figure 5:
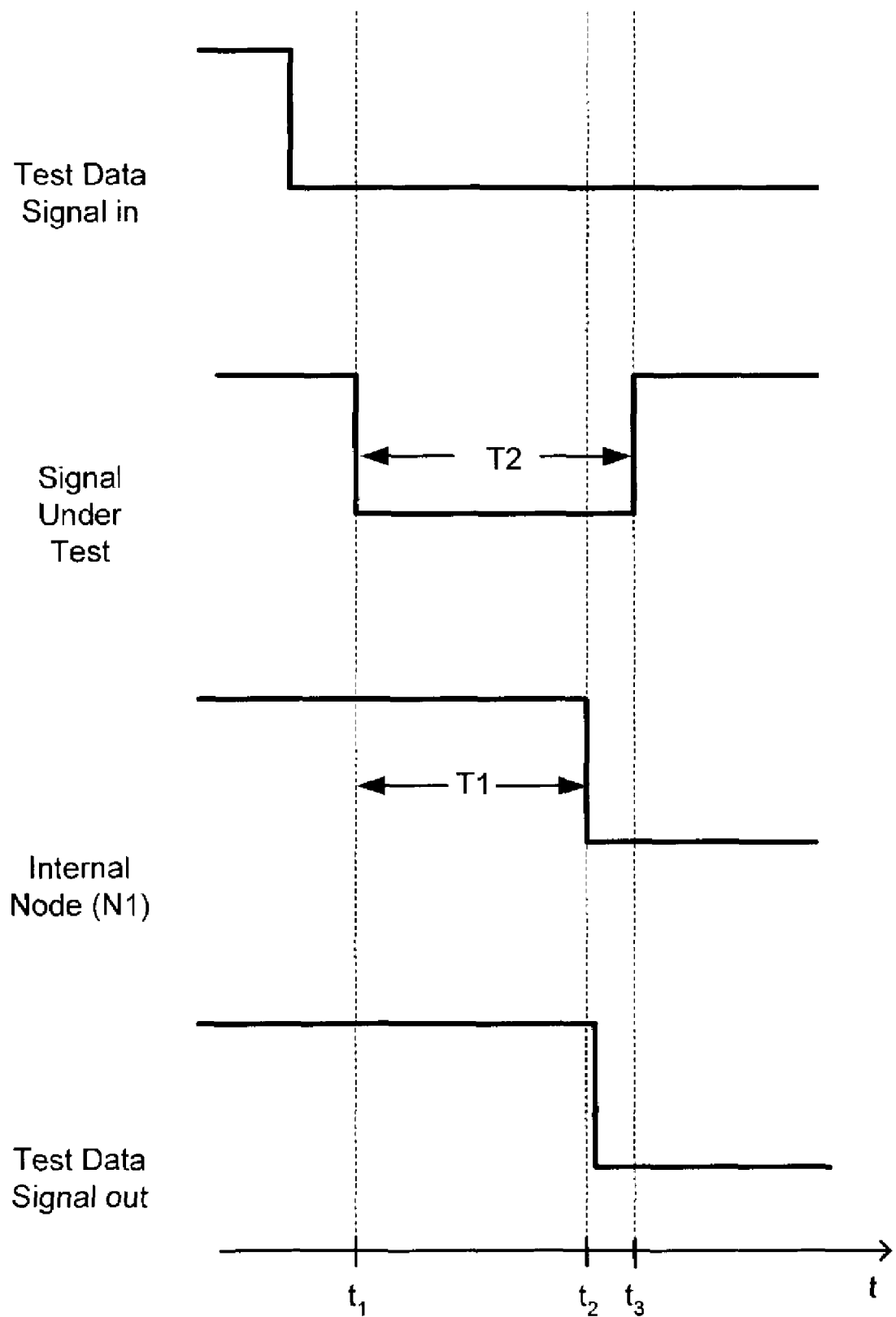
FIGS. 5 and 6 depict examples of various test data signal and signal under test waveforms that may be generated by the signal duration measurement system of FIG. 1 as modified by the gate and latch circuit of FIG. 7.
Figure 6:
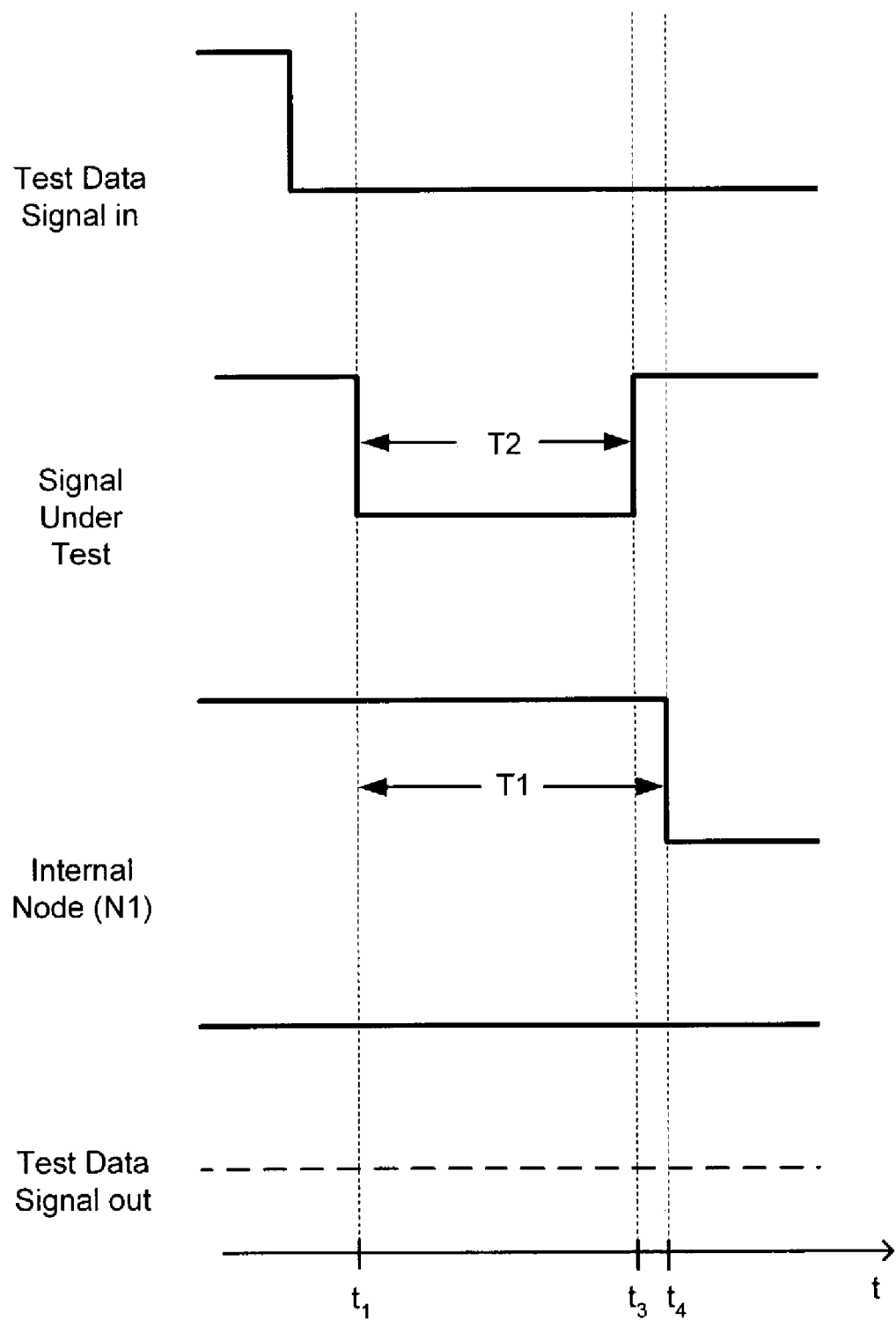

FIGS. 5 and 6 demonstrate that the signal state duration measurement system 100 can also effectively measure the 'low' state duration of the signal under test when gate and latch circuits 116 and 118 are each replaced by gate and latch circuit 700. Gate and latch circuit 700 uses the control terminal of P-channel MOSFET 702 to receive the signal under test and an inverter 704 to bias the substrate of P-channel MOSFET 702. Signal duration measurement process 200 operates as discussed above. In FIG. 5, the initial state of the test data signal, determined at t1, is 'low' and the captured state, determined at t3, is 'low'. Thus, the initial and captured states of the test data signal match because the 'low' state duration, T2, of the signal under test is greater than T1. In FIG. 6, increasing the propagation delay time of data signal propagation path 104 to t4−t1, by selecting a delay unit with a longer delay, prevents test data signal 'in' from reaching switch 702 within the time T2. Thus, the initial and captured states of the test data signal do not match, and the duration T2 is less than or equal to T1 Signal duration measurement process 200 would continue to operate as discussed above.

Although the present invention has been described in detail, it should be understood that various changes, substitutions and alterations can be made hereto without departing from the spirit and scope of the invention as defined by the appended claims. For example, more complicated test data signal patterns, such as multiple cycles of the test data signal, could be used provided that the initial and captured states can be related in time. Additionally, operation 216 could reflect T2 is greater than T1, and operation 214 could reflect T2 is less than or equal to T1.

What is claimed is:

1. A method comprising:
    (a) selecting a propagation time T1 of a data signal;
    (b) allowing the data signal to propagate along a signal path on the chip during a propagation time T1, wherein the beginning of the propagation time T1 is determined by a signal under test having a state period of T2;
    (c) capturing the data signal on the signal path by the end of the propagation time using the on-chip circuitry, wherein the end of the propagation time T1 is also determined by the signal under test; and
    (d) comparing the captured data signal with the received data signal to determine a relationship between time T1 and period T2.

2. The method of claim 1 further comprising:
    if the period T2 is greater than the time T1, increasing the propagation time T1 and repeating (b) through (d); and
    if the period T2 is less than the time T1, decreasing the propagation time T1 and repeating (b) through (d).

3. The method of claim 1 wherein comparing the captured data signal further comprises comparing the captured data signal with the received data signal using on-chip circuitry.

4. The method of claim 1 wherein allowing the data signal to propagate along a signal path during the propagation time T1 further comprises selecting an amount of delay from a plurality of delay amount choices to establish the propagation time T1.

5. The method of claim 1 wherein the propagation time T1 represents the propagation delay of one state of the data signal beginning at the time the data signal is allowed to propagate along the signal path.

6. The method of claim 5 wherein the data signal is a binary signal and the state of the data signal is 'high'.

7. An integrated circuit comprising circuitry operable to perform the method of claim 1.

8. A method comprising:
    receiving a data signal using on-chip circuitry at time t1, wherein time t1 is determined by a signal under test;
    maintaining a state of the data signal for a period T1;
    capturing the data signal using the on-chip circuitry at time t2, wherein time t2 is also determined by the signal under test; and
    comparing a state of the captured data signal with the state of the received data signal to determine a relationship between period T1 and period T2, wherein period T2 equals t2 a minus t1.

9. The method of claim 8 wherein maintaining a state of the data signal further comprises delaying a state transition of the data signal for a period of time, and the method further comprises:
    repeating the method of claim 1 for successively longer delays until a comparison between periods T1 and T2 results in period T2 being less than or equal to T1.

10. The method of claim 9 wherein delaying a state transition of the data signal comprises:
    selecting a delay element of the on-chip circuitry; and
    propagating the data signal through the delay element.

11. The method of claim 8 wherein:
    receiving a data signal using on-chip circuitry further comprises allowing the data signal to propagate to a capture circuit of the on-chip circuitry; and
    capturing a state of the data signal further comprises latching the data signal using the capture circuit.

12. The method of claim 8 wherein comparing a state of the captured data signal comprises utilizing on-chip circuitry.

13. The method of claim 8 wherein the relationship between period T1 and T2 is a relationship between a pulse width of the signal under test and period T1.

14. The method of claim 8 wherein the period T1 represents a propagation delay time of the test data signal from receipt of the data signal until capture of the test data signal as delayed by on-chip elements including any delay element.

15. An integrated circuit comprising circuitry operable to perform the method of claim 8.

16. A method of measuring a state duration of an on-chip signal under test using on-chip circuitry, the method comprising:
    (a) selecting a delay element along a signal path;
    (b) causing a first switch at the beginning of the signal path and a second switch at the end of a signal path to conduct upon a state change of the signal under test;
    (c) allowing a test data signal with a first state to propagate along the signal path and through the delay element to the second switch for a period of time T1;
    (d) causing the first switch and the second switch to stop conducting upon a next change of state of the signal under test wherein the signal under test changes state after a period of T2;
    (e) latching a state of the test data signal when the second switch stops conducting;

(f) comparing the latched test data signal state to the first state of the test signal; and (g) wherein:
if the first state of the test signal fails to match the latched state of the test data signal, then the state duration of the signal under test is measured to be less than T1; and
if the first state of the test signal matches the latched state of the test data signal, then the state duration of the signal under test is measured to be greater than T1.

17. The method of claim 16 further comprising:
if the first state of the test signal fails to match the latched state of the test data signal, selecting another delay element having a shorter delay than the previous delay element and repeating (b) through (g); and
if the first state of the test signal matches the latched state of the test data signal, selecting another delay element having a longer delay than the previous delay element and repeating (b) through (g).

18. The method of claim 16 wherein the signal under test is coupled to control terminals of the switches to control conduction of the switches.

19. The method of claim 16 wherein the change of state of the signal under test is selected from the group consisting of (i) from high to low and (ii) low to high.

20. The method of claim 16 wherein successive delay elements include previous delay elements.

21. An apparatus comprising:
a first on-chip switch having an input node to receive a data signal at time t1 and a conductivity control node to receive a signal under test;
an on-chip delay circuit having an input node coupled to an output node of the first switch and having a selection node coupled to delay control circuitry;
an on-chip second switch having an input node coupled to an output node of the delay circuit and a conductivity control node to receive the signal under test;
an on-chip data signal capture circuit coupled to an output node of the second switch to capture the data signal at time t2; and
a comparison circuit coupled to the first switch and coupled to the data signal capture circuit to compare (a) the data signal received by the first on-chip switch when the signal under test at time t3 causes the first switch to conduct the data signal to (b) the data signal captured by the data signal capture circuit when the signal under test subsequently at time t4 causes the second switch to become nonconductive.

22. The apparatus of claim 21 further comprising:
the delay control circuitry to (i) increase a delay of the on-chip delay circuit if a state of the data signal received by the first on-chip switch matches a state of the data signal captured by the data signal capture circuit and (ii) decrease a delay of the on-chip delay circuit if a state of the data signal received by the first on-chip switch fails to match a state of the data signal captured by the data signal capture circuit.

23. The apparatus of claim 21 further comprising:
the delay control circuitry having an output node coupled to the selection node of the delay circuit to increase the delay of the delay circuit if t4−t3 (T2) is greater than or equal to t2−t1 (T1).

24. The apparatus of claim 21 wherein the delay circuitry comprises:
a multiplexer having N input nodes and the selection node; and
N delay elements arranged in parallel, each having a common input node coinciding with the delay circuit input node and an output node coupled to a respective input node of the multiplexer.

25. The apparatus of claim 21 wherein the first and second switch are the same type, wherein the type is selected from the group consisting of (a) N-channel field effect transistors and (b) P-channel field effect transistors.

26. An integrated circuit comprising:
means to select a propagation time T1 of a data signal;
a signal path on the integrated circuit;
means, coupled to the means to select and the signal path, to allow the data signal to propagate along the signal path during a propagation time T1, wherein the beginning of the propagation time T1 is determined by a signal under test having a state period of T2;
means, coupled to the means to allow, to capture the data signal on the signal path by the end of the propagation time, wherein the end of the propagation time T1 is also determined by the signal under test; and
means, coupled to the means to capture, to compare the captured data signal with the received data signal to determine a relationship between time T1 and period T2.

* * * * *